United States Patent
Yamasaki

(10) Patent No.: US 12,194,542 B2
(45) Date of Patent: Jan. 14, 2025

(54) COATED TOOL AND CUTTING TOOL INCLUDING SAME

(71) Applicant: KYOCERA CORPORATION, Kyoto (JP)

(72) Inventor: Tsuyoshi Yamasaki, Tsukuba (JP)

(73) Assignee: KYOCERA CORPORATION, Kyoto (JP)

( * ) Notice: Subject to any disclaimer, the term of this patent is extended or adjusted under 35 U.S.C. 154(b) by 652 days.

(21) Appl. No.: 17/598,209

(22) PCT Filed: Mar. 25, 2020

(86) PCT No.: PCT/JP2020/013363
§ 371 (c)(1),
(2) Date: Sep. 24, 2021

(87) PCT Pub. No.: WO2020/196631
PCT Pub. Date: Oct. 1, 2020

(65) Prior Publication Data
US 2022/0176462 A1 Jun. 9, 2022

(30) Foreign Application Priority Data
Mar. 27, 2019 (JP) ................. 2019-060829

(51) Int. Cl.
C23C 14/06 (2006.01)
B23B 27/14 (2006.01)
C23C 28/00 (2006.01)
C23C 28/04 (2006.01)
B23C 5/16 (2006.01)

(52) U.S. Cl.
CPC .......... *B23B 27/14* (2013.01); *C23C 14/0641* (2013.01); *C23C 28/044* (2013.01); *C23C 28/42* (2013.01); *B23C 5/16* (2013.01); *B23C 2224/14* (2013.01); *B23C 2224/24* (2013.01)

(58) Field of Classification Search
None
See application file for complete search history.

(56) References Cited

U.S. PATENT DOCUMENTS

2011/0058909 A1  3/2011  Matsuzawa
2011/0117344 A1  5/2011  Chen et al.
(Continued)

FOREIGN PATENT DOCUMENTS

CN  101952070 A  1/2011
EP  1260611 A2 * 11/2002  ......... C23C 14/0641
(Continued)

Primary Examiner — Alexandre F Ferre
(74) Attorney, Agent, or Firm — HAUPTMAN HAM, LLP

(57) ABSTRACT

A coated tool includes a base and a coating layer on the base. The coating layer includes a cubic crystal that includes one or more kinds of elements selected from Groups 4, 5 and 6 in the periodic table, Al, Si, B, Y and Mn, and one or more kinds of elements selected from C, N and O. A maximum peak is in a range of 50° or more in a distribution of X-ray intensity (111) at α axis of a pole figure, the X-ray intensity regarding a (111) plane of the cubic crystal. The intensity at the maximum peak is Imax, a peak width at 0.8 Imax of the maximum peak is 20° or more, and the intensity at 90° is 0.78 Imax or more. A cutting tool includes a holder which includes a pocket at an end, and the coated tool in the pocket.

20 Claims, 8 Drawing Sheets

(56) References Cited

U.S. PATENT DOCUMENTS

| | | |
|---|---|---|
| 2012/0128971 A1 | 5/2012 | Shibata |
| 2020/0222989 A1 | 7/2020 | He et al. |
| 2021/0138558 A1 | 5/2021 | He et al. |

FOREIGN PATENT DOCUMENTS

| | | | |
|---|---|---|---|
| EP | 2305405 A1 * | 4/2011 | ........... C23C 14/022 |
| JP | 2009203485 A | 9/2009 | |
| JP | 2009203489 A | 9/2009 | |
| WO | 2010007958 A1 | 1/2010 | |
| WO | 2011016488 A1 | 2/2011 | |
| WO | 2019044714 A1 | 3/2019 | |
| WO | 2019146711 A1 | 8/2019 | |

* cited by examiner

Distribution of X-ray intensity of pole figure
regarding (111) plane of cubic crystal Distribution of X-ray intensity of pole figure regarding (111) plane of cubic crystal Distribution of X-ray intensity of pole figure regarding (111) plane of cubic crystal Distribution of X-ray intensity of pole figure regarding (200) plane of cubic crystal

COATED TOOL AND CUTTING TOOL INCLUDING SAME

RELATED APPLICATIONS

The present application is a National Phase of International Application No. PCT/JP2020/013363, filed Mar. 25, 2020, and claims priority based on Japanese Patent Application No. 2019-060829, filed Mar. 27, 2019.

TECHNICAL FIELD

The present disclosure relates to a coated tool for use in a cutting process, and a cutting tool including the coated tool.

BACKGROUND

As a coated tool for use in a cutting process, such as a turning process and a milling process, a coating member for a cutting tool, which is configured to provide a coating film to a base material and described, for example, in Patent Document 1, has been known. The coated tool described in Patent Document 1 includes a tool base member and a hard coating film that is made of metal compound in a cubic shape and coats the tool base member. Then, Patent Document 1 describes that, when the hard coating film made of metal compound has each of a (111) plane and a (200) plane tilted at a predetermined angle to a surface of the tool base member, the coated tool is improved in wear resistance.

RELATED ART DOCUMENTS

Patent Document

Patent Document 1: WO 2011/016488 A

SUMMARY

A coated tool according to the present disclosure includes a base and a coating layer located on the base. The coating layer includes a cubic crystal that includes one or more kinds of elements selected from Groups 4, 5 and 6 in the periodic table, Al, Si, B, Y and Mn, and one or more kinds of elements selected from C, N and O. A maximum peak is located in a range of 50° or more in a distribution of X-ray intensity (111) indicated at α axis of a pole figure, the X-ray intensity regarding a (111) plane of the cubic crystal. The intensity at the maximum peak is Imax, a peak width at 0.8 Imax of the maximum peak is 20° or more, and the intensity at 90° is 0.78 Imax or more. A cutting tool according to the present disclosure includes a holder which extends from a first end toward a second end and includes a pocket located at a side of the first end, and the coated tool located in the pocket.

EMBODIMENTS

<Coated Tool>

Figure 1:
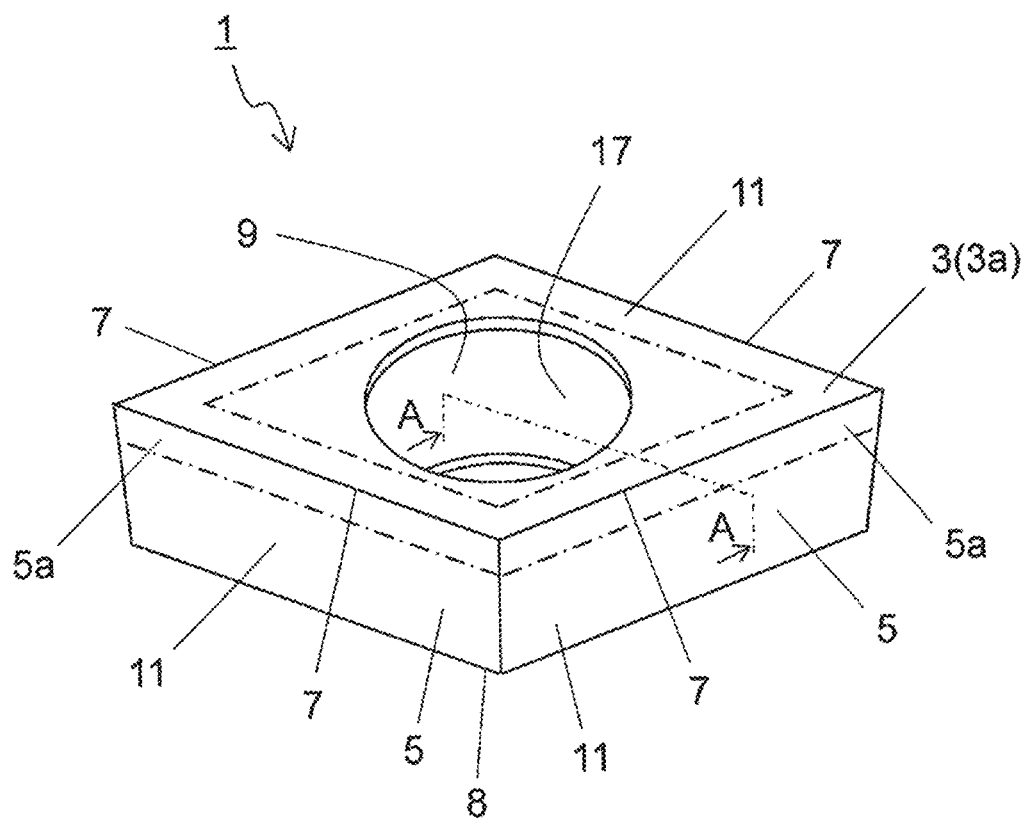
FIG. 1 is a perspective view illustrating an example of a coated tool according to the present disclosure.

A coated tool according to the present disclosure will be described in detail below with reference to the drawings. For the sake of description, the drawings referred to in the following illustrate, in a simplified form, only main members necessary for describing an embodiment. The coated tool according to the present disclosure is therefore capable of including any arbitrary structural member not illustrated in the drawings referred to. Sizes of the members in each of the drawings faithfully represent neither sizes of actual structural members nor size ratios of these members. The same applies to a cutting tool as will be described later.

A coated tool 1 according to the present disclosure has a quadrangular plate shape and includes a first surface 3 (upper surface in FIG. 1) having a quadrangular shape, a second surface 5 (side surface in FIG. 1), and a cutting edge 7 located on at least a part of a ridge line where the first surface 3 intersects with the second surface 5. The coated tool 1 according to the embodiment further includes a third surface 8 (lower surface in FIG. 1) having the quadrangular shape.

The entirety of an outer periphery of the first surface 3 may correspond to the cutting edge 7 in the coated tool 1 according to the present disclosure. However, the coated tool 1 is not limited to the above configuration. For example, the cutting edge 7 may be located on only one side or a part of the first surface 3 having the quadrangular shape.

The first surface 3 at least partially includes a rake surface region 3a. In the first surface 3, the region which is located along the cutting edge 7 may serve as the rake surface region 3a. The second surface 5 at least partially includes a flank surface region 5a. In the second surface 5, the region which is located along the cutting edge 7 may serve as the flank surface region 5a. In other words, with this configuration, the cutting edge 7 may be located on an intersecting part of the rake surface region 3a and the flank surface region 5a.

In FIG. 1, a boundary between the rake surface region 3a and other region on the first surface 3 is indicated by a chain line. Additionally, a boundary between the flank surface region 5a and other region on the second surface 5 is indicated by a chain line. Because FIG. 1 illustrates an example in which all the ridge line where the first surface 3 intersects with the second surface 5 serves as the cutting edge 7, the boundary above on the first surface 3 is indicated by the chain line of a ring shape.

A size of the coated tool 1 is not particularly limited. For example, a length of one side of the first surface 3 may be set to approximately 3-20 mm. A height from the first surface 3 to the third surface 8 located on an opposite side of the first surface 3 may be set to approximately 5-20 mm.

Figure 2:
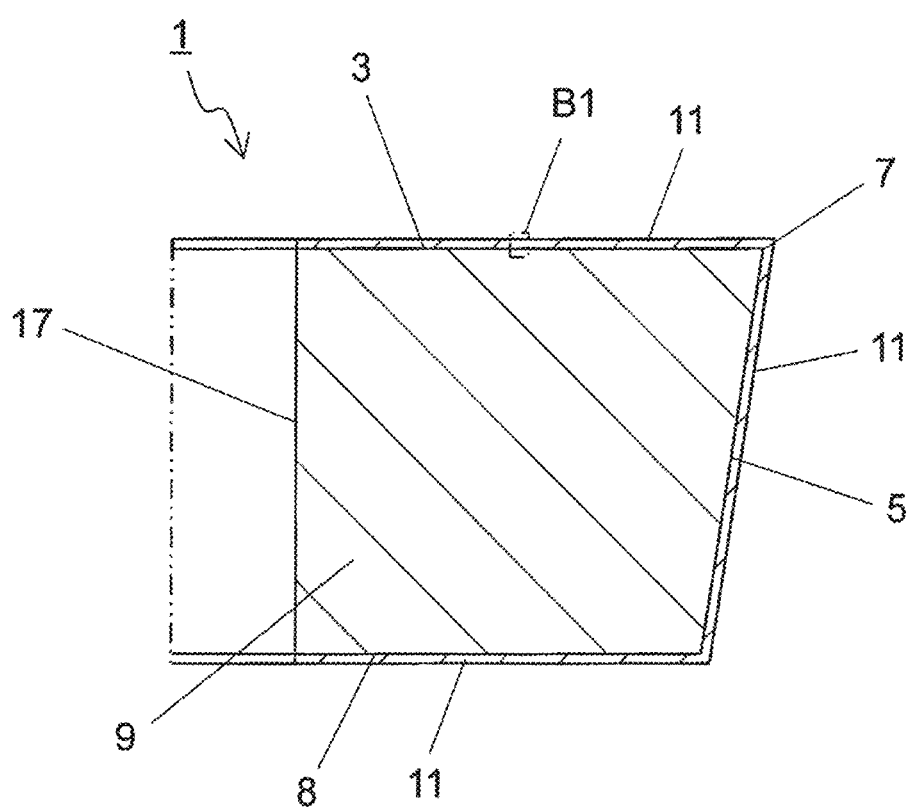
FIG. 2 is a sectional view taken along line A-A in the coated tool illustrated in FIG. 1.

As illustrated in FIG. 1 and FIG. 2, the coated tool 1 according to the present disclosure includes a base 9 having the quadrangular plate shape and a coating layer 11 that coats a surface of the base 9. The coating layer 11 may cover the whole or only a part of the surface of the base 9. If the coating layer 11 covers only the part of the base 9, it can be said that the coating layer 11 is located on at least the part of the base 9.

A thickness of the coating layer 11 may be set to, for example, approximately 0.1-10 μm. The thickness of the coating layer 11 may be constant or may be changed depending on location.

Figure 3A:
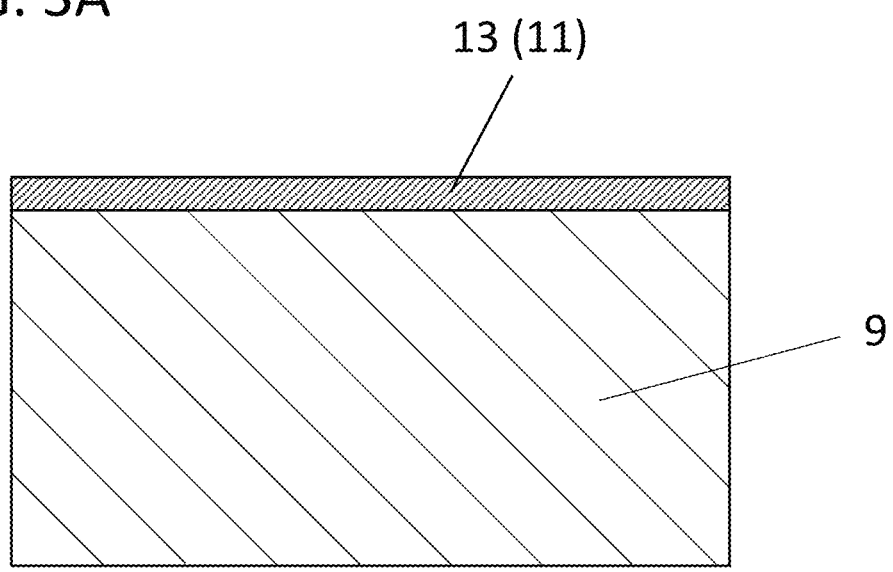
FIG. 3A is an enlarged view of a region B1 illustrated in FIG. 2.

As illustrated in FIG. 3A, the coated tool 1 according to the present disclosure includes the coating layer 11 on the surface of the base 9. The coating layer 11 includes a cubic crystal that includes one or more kinds of elements selected from Groups 4, 5 and 6 in the periodic table, Al, Si, B, Y and Mn, and one or more kinds of elements selected from C, N and O. The cubic crystal is, for example, AlTiN, AlCrN or TiN. The TiAlN crystal is a crystal where Al is solid-dissolved in the TiN crystal.

Each of these cubic crystals has high hardness and excellent wear resistance, and is preferably used for the coating layer 11 of the coated tool 1.

With the coated tool 1 according to the present disclosure, the cubic crystal in the coating layer 11 is controlled in orientation, so that the coated tool 1 is improved in durability. The cubic crystal included in the coating layer 11 includes a (111) plane. In order to evaluate the orientation of the cubic crystal in the coating layer 11, an X-ray diffraction device is used to measure an angle of the (111) plane of the cubic crystal in the coating layer 11 tilted to the surface of the base 9.

Figure 4:
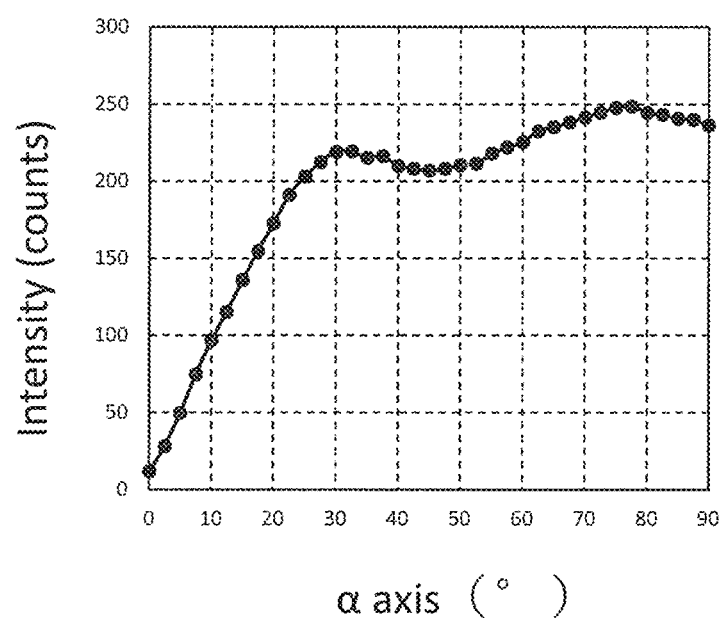
FIG. 4 is an example of a distribution of X-ray intensity indicated at α axis of a pole figure, the X-ray intensity regarding a (111) plane of a cubic crystal included in a coating layer of the coated tool according to the present disclosure.

As illustrated in FIG. 4, it is possible to evaluate the orientation in the (111) plane of the cubic crystal based on a distribution of X-ray intensity (111) on a pole figure.

For example, if showing a peak at a position of 50° in the distribution of X-ray intensity in a range of 0 to 90° at α axis of the pole figure of the (111) plane of the cubic crystal, the cubic crystal including the (111) plane tilted at 50° to the surface of the base 9 is assumed to be large in quantity.

As illustrated in FIG. 4, with the coated tool 1 according to the present disclosure, the coating layer 11 includes a maximum peak located in a range of 50° or more in the distribution of X-ray intensity (111) indicated in a range of 0° to 90° at α axis of the pole figure, the X-ray intensity regarding the (111) plane of the cubic crystal. The intensity at the maximum peak is Imax, a peak width at 0.8 Imax of the maximum peak is 20° or more.

In other words, the maximum peak in the distribution of X-ray intensity (111) is located at a high angle side, and the intensity of 0.8 Imax or more is located in a wide range of 20° or more.

Additionally, in the coated tool 1 of the present disclosure, the intensity at 90° is 0.78 Imax or more. The coated tool 1 of the present disclosure has high intensity even at 90°.

Because of this configuration, the coated tool 1 of the present disclosure is excellent in durability.

In the coating layer 11, a peak of 0.8 Imax (111) or more may be identified in a range of 25° or more. With such a configuration, the coated tool has excellent durability.

In the coated tool 1 of the present disclosure, in the distribution of X-ray intensity (111), a peak width at 0.9 Imax of the maximum peak is 15° or more. With such a configuration, the coated tool 1 is excellent in durability because a region having higher X-ray intensity is widely located at the high angle side.

In the coated tool 1 of the present disclosure, in the distribution of X-ray intensity (111), the peak intensity at 90° may be 0.9 Imax or more. With such a configuration, the coated tool 1 has excellent durability because of high orientation of the (111) plane of the cubic crystal even at a high angle of 90°.

In the coated tool 1 of the present disclosure, in the distribution of X-ray intensity (111), the peak intensity at 15° or less may be less than 0.6 Imax. With such a configuration, the orientation of the (111) plane at a low angle side becomes low, and the orientation intensity of the (111) plane is relatively greater at the high angle side, so that the coated tool has excellent durability.

Figure 7:
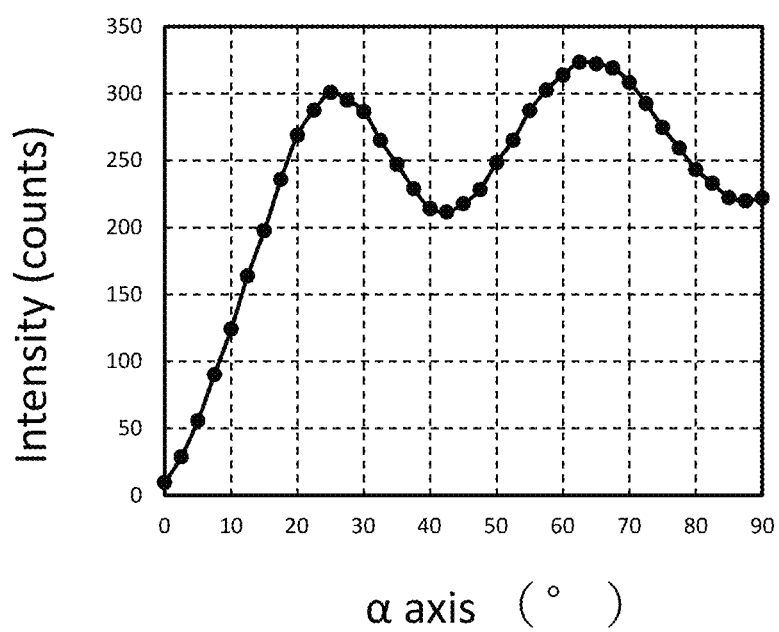
FIG. 7 is an example of a distribution of X-ray intensity indicated at α axis of a pole figure, the X-ray intensity regarding a (200) plane of a cubic crystal included in a coating layer of the coated tool according to the present disclosure.

Further, as illustrated in FIG. 7, in a distribution of X-ray intensity indicated in a range of 0° to 90° at a axis of a pole figure, the X-ray intensity regarding a (200) plane of the cubic crystal, the coating layer 11 may include a first peak and a second peak located at a higher angle side than the first peak. The coating layer 11 may further include a valley part between the first peak and the second peak, and the valley part includes the X-ray intensity smaller than the X-ray intensity at each of the first peak and the second peak.

Including the first peak and the second peak in the range of 0° to 90° in the distribution of X-ray intensity indicated at α axis of the pole figure regarding the (200) plane of the cubic crystal, the coated tool 1 is excellent in durability.

Further, as illustrated in FIG. 7, in the distribution of X-ray intensity indicated at α axis of the pole figure regarding the (200) plane of the cubic crystal, the coating layer may include the first peak located in a range of 15° to 30°, and the second peak located in a range of 60° to 75°. With this configuration, the coating layer 11 is increased in hardness and peeling load.

Characteristic of the coated tool 1 is evaluable based on, for example, hardness or a peeling load measured in a scratch test. The durability of the coated tool 1 is affected by the hardness and the peeling load. If being high in only one of hardness and peeling load, the coated tool 1 is not sufficiently durable. The coated tool 1 according to the present disclosure is well balanced in hardness and peeling load, and is thus excellent in durability.

The coating layer 11 may include an AlTiN layer 13 including the AlTiN crystal as the cubic crystal. The AlTiN layer 13 may include a higher content ratio of aluminum than that of titanium. Alternatively, the AlTiN layer 13 may include a higher content ratio of titanium than that of aluminum. Still alternatively, the AlTiN layer 13 may include chromium in addition to aluminum and titanium. In this case, a total of the content ratios of aluminum and titanium is higher than a content ratio of chromium. The content ratio of chromium included in the AlTiN layer 13 may be set to, for example, 0.1-20%. The term "content ratio" indicates a content ratio in terms of atomic ratio.

Further, the coating layer 11 may include an AlCrN layer including an AlCrN crystal as the cubic crystal.

Figure 3B:
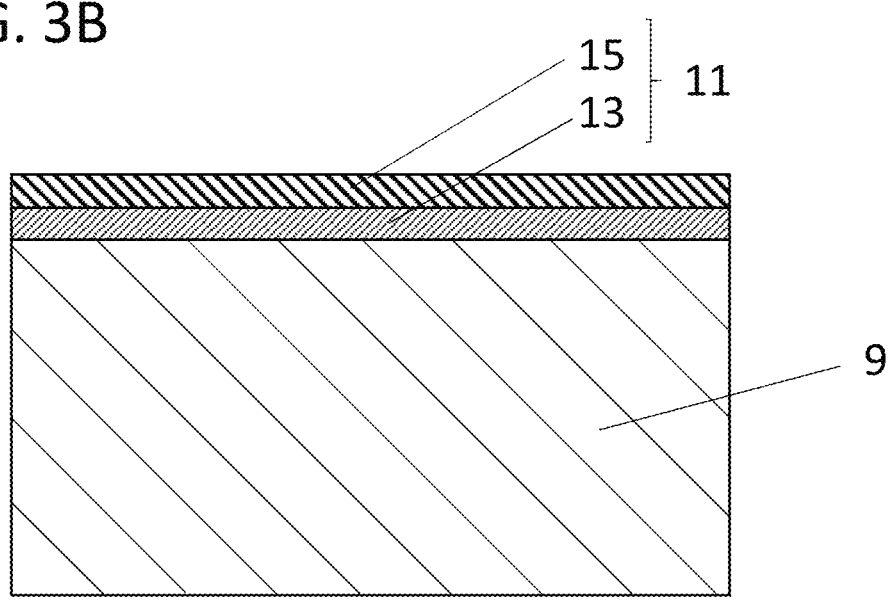
FIG. 3B is an enlarged view of a region B1 according to another embodiment, the region B1 illustrated in FIG. 2.

Further, as illustrated in FIG. 3B, the coated tool 1 according to the present disclosure may include an AlCrN layer 15 including an AlCrN crystal, in addition to the AlTiN layer 13. A plurality of the AlTiN layers 13 and a plurality of the AlCrN layers 15 may be respectively laminated. In this case, the plurality of AlTiN layers 13 and the plurality of AlCrN layers 15 may be laminated in a reverse order, or may be alternately laminated one upon another.

The AlCrN layer 15 may include only aluminum and chromium. Alternatively, the AlCrN layer 15 may include a metal component such as Si, Nb, Hf, V, Ta, Mo, Zr, Ti and W, in addition to aluminum and chromium. In this case, in the AlCrN layer 15, a total of the content ratios of aluminum and chromium is higher than a content ratio of the metal component. The content ratio of aluminum may be set to, for example, 20 to 60%. The content ratio of chromium may be set to, for example, 40 to 80%.

If the coated tool 1 includes the plurality of AlCrN layers 15, each of the AlCrN layers 15 may include the higher content ratio of aluminum than that of chromium, or alternatively, each of the plurality of AlCrN layers 15 may include the higher content ratio of chromium than that of aluminum.

Each of the AlCrN layers 15 may only include a metal component including aluminum and chromium. Alternatively, each of the AlCrN layers 15 may include nitride, carbide or carbonitride, each including one of, or both of, aluminum and chromium.

Compositions of the AlTiN layer 13 and the AlCrN layer 15 are measurable using, for example, energy dispersive X-ray spectroscopy (EDS) or X-ray photoelectron spectroscopy (XPS).

The number of the AlTiN layers 13 laminated and the number of the AlCrN layers 15 laminated are not limited to a specific value. The number of the AlTiN Layers 13 and the number of the AlCrN layers 15 may be set to, for example, 2 to 500.

If including the AlTiN layer 13, the coating layer 11 is increased in fracture resistance. If including the AlCrN layer 15, the coating layer 11 is increased in wear resistance. With a configuration where the plurality of AlTiN layers 13 and the plurality of AlCrN layers 15 are alternately located, the coating layer 11 is increased in entire strength.

Note that, the coating layer 11 is greater in entire strength if each of the plurality of AlTiN layers 13 and each of the plurality of AlCrN layers 15 are smaller in thickness and the number of the plurality of AlTiN layers 13 and the number of the plurality of AlCrN layers 15 are greater, compared with if each of the plurality of AlTiN layers 13 and each of the plurality of AlCrN layers 15 are greater in thickness and the number of the plurality of AlTiN layers 13 and the number of the plurality of AlCrN layers 15 are smaller.

The thickness of the AlTiN layer 13 and the thickness of the AlCrN layer 15 are not limited to a specific value, but are individually settable to 5-100 nm. The thicknesses of the plurality of AlTiN layers 13 and the thicknesses of the plurality of AlCrN layers 15 may be constant or different from each other.

Note that, the coated tool 1 according to the present disclosure has the quadrangular plate shape as illustrated in FIG. 1, but the shape of the coated tool 1 is not limited thereto. There is no problem even if each of the first surface 3 and the third surface 8 does not have the quadrangular shape but may have, for example, a triangular shape, a hexagonal shape or a circular shape.

As illustrated in FIG. 1, the coated tool 1 according to the present disclosure may include, for example, a through hole 17. The through hole 17 is extended from the first surface 3 to the third surface 8 located on the opposite side of the first surface 3, and the through hole 17 opens into these surfaces.

The through hole 17 is usable for attaching a screw or clamping member when holding the coated tool 1 onto a holder. There is no problem even if the through hole 17 opens into regions located on opposite sides in the second surface 5.

Examples of material of the base 9 include inorganic materials, such as cemented carbide, cermet and ceramics. Examples of composition of cemented carbide include WC(tungsten carbide)-Co, WC—TiC(titanium carbide)-Co, and WC—TiC—TaC(tantalum carbide)-Co. Specifically, WC, TiC and TaC are hard particles, and Co is a binding phase. The cermet is a sintered composite material obtainable by compositing metal into a ceramic component. Specific examples of the cermet include compounds composed mainly of TiC or TiN (titanium nitride). The material of the base 9 is not limited to these materials.

The coating layer 11 can be located on the base 9 by using, for example, physical vapor deposition (PVD) method. In cases where the coating layer 11 is deposited with the base 9 held on an inner peripheral surface of the through hole 17 by using the above vapor deposition method, the coating layer 11 can be located so as to cover the entirety of the surface of the base 9 except for the inner peripheral surface of the through hole 17.

Examples of the physical deposition method includes ion plating method and sputtering method. As one embodiment of the deposition with the ion plating method, the coating layer 11 can be deposited with the following method.

In a first procedure, a metal target including one or more kinds of elements selected from Groups 4, 5 and 6 in the periodic table, Al, Si, B, Y and Mn, a composite alloy target or a sintered body target is prepared. The above target serving as a metal source is vaporized and ionized by an arc discharge or a glow discharge. The ionized target is reacted with nitrogen ($N_2$) gas as a nitrogen source, and methane ($CH_4$) gas or acetylene ($C_2H_2$) gas as a carbon source, and is deposited on the surface of the base 9. For example, the coating layer 11 including a cubic crystal such as an AlTiN layer or an AlCrN layer is formable through the above procedure. The coating layer 11 may be a single layer or a laminated layer.

In the case of laminating layers alternately, in a second procedure, the metal target including one or more kinds of elements selected from Groups 4, 5 and 6 in the periodic table, Al, Si, B, Y and Mn, the composite alloy target or the sintered body target is prepared. The above target serving as a metal source is vaporized and ionized by an arc discharge or a glow discharge. The ionized target is reacted with nitrogen ($N_2$) gas as a nitrogen source, and methane ($CH_4$) gas or acetylene ($C_2H_2$) gas as a carbon source, and is deposited on the surface of the base 9. For example, the coating layer 11 in which the AlTiN layer 13 and the AlCrN layer 15 are laminated is formable through the above procedure.

The coating layer 11 having the configuration where the plurality of AlTiN layers 13 and the plurality of AlCrN layers 15 are alternately laminated one upon another is formable by alternately repeating the first procedure and the second procedure. The first procedure may be carried out after the second procedure. Also, the coating layer 11 may include only a single layer.

To obtain the coated tool 1 of the present disclosure, in the first and the second procedures described above, with a temperature of the base set to 300 to 600° C., pressure set to 2.0 to 6.0 Pa, a direct current bias voltage of −55 to −95 V may be applied to the base, and the arc discharge current set to 120 to 180 A.

Of the deposition conditions, a peak width at 0.8 Imax, a peak width at 0.9 Imax, and intensity at 90° can be changed by changing the direct current bias voltage.

The direct current bias voltage may be set to 60 V or more and 90 V or less. The direct current bias voltage may be set to 65 V or more and 85 V or less. With such deposition conditions, the peak width at 0.8 Imax and the peak width at 0.9 Imax are wide, and the intensity at 90° is high.

<Cutting Tool>

Next, a cutting tool according to the present disclosure will be described below with reference to the drawings.

Figure 8:
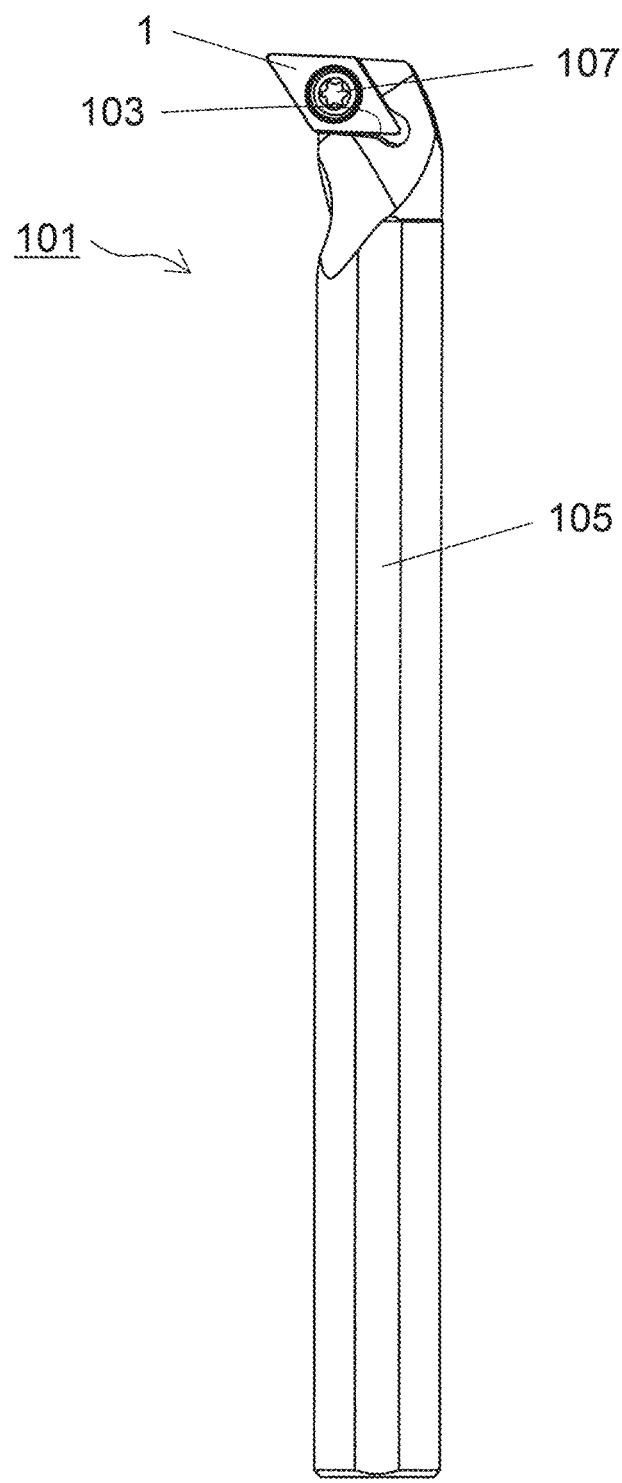
FIG. 8 is a plan view illustrating an example of a cutting tool according to the present disclosure.

As illustrated in FIG. 8, a cutting tool 101 according to the present disclosure is a bar-shaped body extended, for example, from a first end (an upper end in FIG. 8) toward a second end (a lower end in FIG. 8). As illustrated in FIG. 8, the cutting tool 101 includes a holder 105 with a pocket 103 located at a side of the first end (tip end), and the coated tool 1 located in the pocket 103. The cutting tool 101 including the coated tool 1 provides the cutting process stably for the long period of time.

The pocket 103 is a part that permits attachment of the coated tool 1. The pocket 103 includes a seating surface parallel to a lower surface of the holder 105, and a constraining side surface inclined relative to the seating surface. The pocket 103 opens into the side of the first end of the holder 105.

The coated tool 1 is located in the pocket 103. A lower surface of the coated tool 1 may be in a direct contact with the pocket 103. Alternatively, a sheet (not illustrated) may be held between the coated tool 1 and the pocket 103.

The coated tool 1 is attached to the holder 105 so that at least a part of the ridge line where the first surface 3 intersects with the second surface 5, which is usable as the cutting edge 7, is protruded outward from the holder 105. The coated tool 1 is attached to the holder 105 by a fixing screw 107 in the embodiment. Specifically, the coated tool 1 is attachable to the holder 105 in such a manner that screw parts are engaged with each other by inserting the fixing screw 107 into the through hole 17 of the coated tool 1, and by inserting a front end of the fixing screw 107 into a screw hole (not illustrated) formed in the pocket 103.

For example, steel and cast iron are usable as a material of the holder 105. Of these materials, high toughness steel may be used.

The embodiment has illustrated and described the cutting tools for use in the so-called turning process. Examples of the turning process include inner diameter processing, outer diameter processing and grooving process. The cutting tools are not limited to ones which are used for the turning process. For example, the coated tools 1 of the above embodiments are applicable to the cutting tools for use in the milling process.

EXAMPLE

A coating layer having a thickness of approximately 5 μm was formed on a surface of WC—Co cemented carbide by alternately laminating an AlTiN layer having a thickness of approximately 15 nm and an AlCrN layer having a thickness of approximately 15 nm one upon another. In forming the coating layer, a temperature of the base was set to 550° C. and pressure was set to 4.0 Pa. Direct current bias voltages of −35 V, −55 V, and −115 V were applied to the base, and the arc discharge current was set to 160 A at the time of forming the AlTiN layer, and it was set to 140 A at the time of forming the AlCrN layer. The examples of the direct current bias voltages of −35 V and −115 V are comparative examples.

Figure 5:
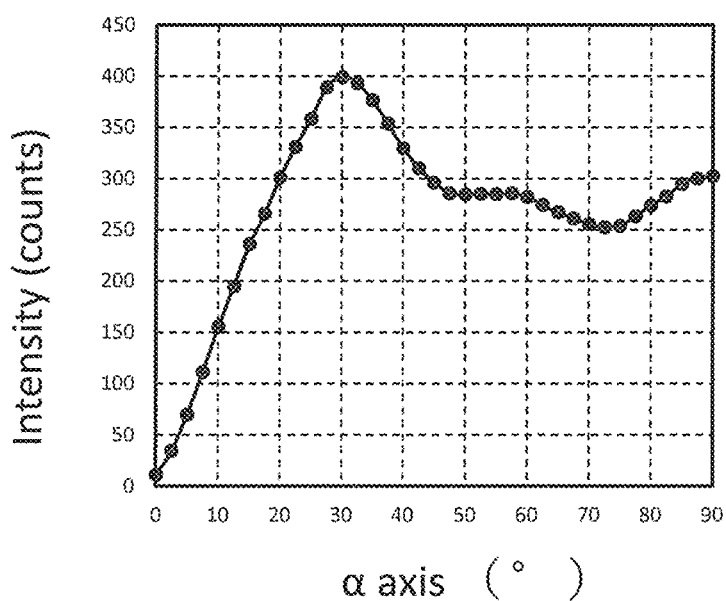
FIG. 5 is an example of a distribution of X-ray intensity indicated at α axis of a pole figure, the X-ray intensity regarding a (111) plane of a cubic crystal included in a coating layer of a coated tool according to a comparative example.
Figure 6:
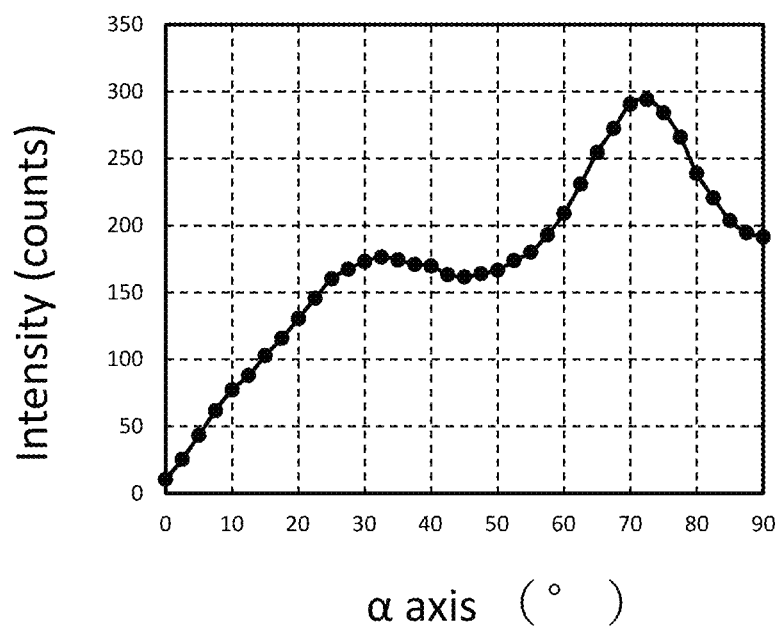
FIG. 6 is an example of the distribution of X-ray intensity indicated at α axis of the pole figure, the X-ray intensity regarding the (111) plane of the cubic crystal included in the coating layer of the coated tool according to a comparative example.

FIG. 4 shows a distribution of X-ray intensity at a axis of a pole figure, the X-ray intensity regarding a (111) plane of the cubic crystal of the coating layer of the sample No. 1 obtained with a direct current bias voltage of −55 V. FIG. 5 shows the distribution of X-ray intensity at α axis of the pole figure, the X-ray intensity regarding the (111) plane of the cubic crystal of the coating layer of the sample No. 2 obtained with a direct current bias voltage of −35 V. FIG. 6 shows the distribution of X-ray intensity at α axis of the pole figure, the X-ray intensity regarding the (111) plane of the cubic crystal of the coating layer of the sample No. 3 obtained with a direct current bias voltage of −115 V. FIG. 7 shows a distribution of X-ray intensity at α axis of a pole figure, the X-ray intensity regarding a (200) plane of the cubic crystal of the coating layer of the sample No. 1 obtained with a direct current bias voltage of −55 V.

A measurement condition of the distribution of X-ray intensity was as follows. If a surface normal of the sample was on a plane determined by an incident line and a diffraction line, an a angle was set to be 90°. If the α angle was 90°, the α angle corresponded to a center point on the pole figure.

Flat plate collimator

Scanning method: concentric circle

β scanning range: 0 to 360°/2.5° pitch

θ fixed angle: a diffraction angle for the (111) plane of the AlTiN crystal was set to an angle in a range of 36.0° to 38.0°, the angle where a diffraction intensity was highest. A diffraction angle for the (200) plane of the AlTiN crystal was set to an angle in a range of 42.0° to 44.0°, the angle where a diffraction intensity was highest.

α scanning range: 0 to 90°/2.5° step

Target: CuKα; voltage: 45 kV; current: 40 mA

The peeling load (load causing the peeling) was measured by a scratch testing device within a load range from 0 to 100 N.

TABLE 1

| Sample No. | Maximum peak (°) | Peak width at 0.8 Imax (°) | Peak width at 0.9 Imax (°) | Intensity at 90° | Hardness (H/GPa) | Peeling load (/N) |
|---|---|---|---|---|---|---|
| 1 | 77.5 | 65 | 25 | 0.95 Imax | 35 | 85.4 |
| 2 | 30 | 17.5 | 7.5 | 0.76 Imax | 32.4 | 85.2 |
| 3 | 72.5 | 15 | 10 | 0.65 Imax | 35.2 | 70.2 |

Table 1 indicates an angle of the maximum peak, a peak width at 0.8 Imax, a peak width at 0.9 Imax, and intensity at 90° of the (111) plane of the cubic crystal of the coating layer in each of the samples No. 1 to 3.

The sample No. 1, which is the coated tool of the present disclosure, had a large peeling load and excellent hardness.

The invention claimed is:

1. A coated tool, comprising:
a base; and
a coating layer located on the base, wherein
the coating layer comprises a cubic crystal that comprises one or more kinds of elements selected from Groups 4, 5 and 6 in the periodic table, Al, Si, B, Y and Mn, and one or more kinds of elements selected from C, N and O, in a distribution of X-ray intensity (111) indicated at a axis of a pole figure, the X-ray intensity regarding a (111) plane of the cubic crystal,
a maximum peak is located in a range of 50° or more,
the X-ray intensity at the maximum peak is Imax, a peak width at 0.8 Imax of the maximum peak is 20° or more, and
the X-ray intensity at 90° is 0.78 Imax or more, and
in the distribution of X-ray intensity (111), a peak width at 0.9 Imax of the maximum peak is 15° or more.

2. The coated tool according to claim 1, wherein,
in the distribution of X-ray intensity (111), the X-ray intensity at 90° is 0.9 Imax or more.

3. The coated tool according to claim 1, wherein,
in the distribution of X-ray intensity (111), the X-ray intensity at 15° or less is less than 0.6 Imax.

4. The coated tool according to claim 1, wherein,
in a distribution of X-ray intensity (200) indicated at α axis of a pole figure, the X-ray intensity regarding a (200) plane of the cubic crystal, the coating layer comprises
a first peak, and
a second peak located at a higher angle side than the first peak, and
the coating layer further comprises
a valley part between the first peak and the second peak, the valley part comprising the X-ray intensity smaller than the X-ray intensity at each of the first peak and the second peak.

5. The coated tool according to claim 4, wherein
the coating layer comprises the first peak in a range of 15° to 30° and comprises the second peak in a range of 60° to 75°.

6. The coated tool according to claim 1, wherein
the coating layer comprises an AlTiN layer comprising an AlTiN crystal as the cubic crystal.

7. The coated tool according to claim 1, wherein
the coating layer comprises an AlCrN layer comprising an AlCrN crystal as the cubic crystal.

8. The coated tool according to claim 7, wherein
the coating layer comprises a plurality of the AlTiN layers and a plurality of the AlCrN layers, and the plurality of the AlTiN layers and the plurality of the AlCrN layers are located alternately one upon another.

9. The coated tool according to claim 1, wherein
the base comprises tungsten carbide and cobalt.

10. A cutting tool, comprising:
a holder extending from a first end toward a second end and comprising a pocket located at a side of the first end; and
the coated tool according to claim 1, the coated tool being located in the pocket.

11. A coated tool, comprising:
a base; and
a coating layer located on the base, wherein
the coating layer comprises a cubic crystal that comprises one or more kinds of elements selected from Groups 4, 5 and 6 in the periodic table, Al, Si, B, Y and Mn, and one or more kinds of elements selected from C, N and O,
in a distribution of X-ray intensity (111) indicated at α axis of a pole figure, the X-ray intensity regarding a (111) plane of the cubic crystal,
a maximum peak is located in a range of 50° or more,
the X-ray intensity at the maximum peak is Imax, a peak width at 0.8 Imax of the maximum peak is 20° or more, and
the X-ray intensity at 90° is 0.78 Imax or more, and
in the distribution of X-ray intensity (111), the X-ray intensity at 90° is 0.9 Imax or more.

12. The coated tool according to claim 11, wherein,
in the distribution of X-ray intensity (111), the X-ray intensity at 15° or less is less than 0.6 Imax.

13. The coated tool according to claim 11, wherein,
in a distribution of X-ray intensity (200) indicated at α axis of a pole figure, the X-ray intensity regarding a (200) plane of the cubic crystal, the coating layer comprises
a first peak, and
a second peak located at a higher angle side than the first peak, and
the coating layer further comprises
a valley part between the first peak and the second peak, the valley part comprising the X-ray intensity smaller than the X-ray intensity at each of the first peak and the second peak.

14. The coated tool according to claim 13, wherein
the coating layer comprises the first peak in a range of 15° to 30° and comprises the second peak in a range of 60° to 75°.

15. The coated tool according to claim 11, wherein
the coating layer comprises an AlTiN layer comprising an AlTiN crystal as the cubic crystal.

16. The coated tool according to claim 11, wherein
the coating layer comprises an AlCrN layer comprising an AlCrN crystal as the cubic crystal.

17. The coated tool according to claim 16, wherein
the coating layer comprises a plurality of the AlTiN layers and a plurality of the AlCrN layers, and the plurality of the AlTiN layers and the plurality of the AlCrN layers are located alternately one upon another.

18. The coated tool according to claim 11, wherein
the base comprises tungsten carbide and cobalt.

19. A cutting tool, comprising:
a holder extending from a first end toward a second end and comprising a pocket located at a side of the first end; and
the coated tool according to claim 11, the coated tool being located in the pocket.

20. A coated tool, comprising:
a base; and
a coating layer located on the base, wherein
the coating layer comprises a cubic crystal that comprises one or more kinds of elements selected from Groups 4, 5 and 6 in the periodic table, Al, Si, B, Y and Mn, and one or more kinds of elements selected from C, N and O,
in a distribution of X-ray intensity (111) indicated at α axis of a pole figure, the X-ray intensity regarding a (111) plane of the cubic crystal,
a maximum peak is located in a range of 50° or more,
the X-ray intensity at the maximum peak is Imax, a peak width at 0.8 Imax of the maximum peak is 20° or more, and
the X-ray intensity at 90° is 0.78 Imax or more,
in a distribution of X-ray intensity (200) indicated at α axis of a pole figure, the X-ray intensity regarding a (200) plane of the cubic crystal, the coating layer comprises
a first peak, and
a second peak located at a higher angle side than the first peak,
the coating layer further comprises a valley part between the first peak and the second peak, the valley part comprising the X-ray intensity smaller than the X-ray intensity at each of the first peak and the second peak, and the coating layer comprises the first peak in a range of 15° to 30° and comprises the second peak in a range of 60° to 75°.

\* \* \* \* \*